United States Patent
Hicks et al.

(10) Patent No.: US 11,307,228 B2
(45) Date of Patent: Apr. 19, 2022

(54) POWER OUTAGE DETERMINATION SYSTEM

(71) Applicant: Cox Communications, Inc., Atlanta, GA (US)

(72) Inventors: David Hicks, Atlanta, GA (US); Imran Lakhani, Atlanta, GA (US); Michael Latino, Atlanta, GA (US); Joshua Paul Bernard Sommer, Atlanta, GA (US); Gregory Devon Thomas, Peachtree Corner, GA (US)

(73) Assignee: Cox Communications, Inc., Atlanta, GA (US)

( * ) Notice: Subject to any disclaimer, the term of this patent is extended or adjusted under 35 U.S.C. 154(b) by 345 days.

(21) Appl. No.: 16/352,638

(22) Filed: Mar. 13, 2019

(65) Prior Publication Data

US 2020/0292595 A1 Sep. 17, 2020

(51) Int. Cl.
*G01R 19/25* (2006.01)
*H02J 9/06* (2006.01)

(52) U.S. Cl.
CPC .......... *G01R 19/2513* (2013.01); *H02J 9/061* (2013.01)

(58) Field of Classification Search
CPC .................................. G01R 19/2513
USPC ........................................ 702/59
See application file for complete search history.

(56) References Cited

U.S. PATENT DOCUMENTS

| | | | |
|---|---|---|---|
| 2008/0181099 A1* | 7/2008 | Torab | H04L 41/5074 370/216 |
| 2011/0119517 A1* | 5/2011 | Beeco | H04L 41/12 713/340 |
| 2014/0204794 A1* | 7/2014 | El-Najjar | H04L 41/12 370/254 |
| 2014/0267788 A1* | 9/2014 | Bowler | H04N 7/10 348/192 |
| 2016/0018458 A1* | 1/2016 | Basu | G01R 31/086 702/59 |
| 2016/0191194 A1* | 6/2016 | Wood | H04J 14/0267 398/58 |
| 2019/0245381 A1* | 8/2019 | Sole | H02J 13/00 |
| 2019/0271731 A1* | 9/2019 | Miron | G01R 15/142 |

* cited by examiner

*Primary Examiner* — Ricky Go

(74) *Attorney, Agent, or Firm* — Eversheds Sutherland (US) LLP

(57) ABSTRACT

Systems, methods, and computer readable media for power outage determination. A device may determine an indication that an outage has occurred on a cable network based on a status of a network device within the cable network, wherein the network device receives power from a power network. The device may determine location information for at least a portion of a plurality of network devices, including the network device, within the cable network. The device may determine a cable topology of the cable network at an area that includes a location that corresponds to the network device. The device may determine a power topology of the power network at the area. The device may analyze the cable topology and the power topology at the area. The device may identify one or more potential failure locations on the power network.

20 Claims, 8 Drawing Sheets

POWER OUTAGE DETERMINATION SYSTEM

BACKGROUND

Over the last two decades, the cable industry has evolved its plant into a two-way broadband network. To improve reliability, the industry has also invested in performance monitoring solutions that manage active network devices, network power supplies, and in-home customer premise equipment (CPE). Information from this broadband network, including from the performance monitoring solutions, may be useful for applications additional to the provision of cable services.

Consumers of cable services may experience a loss of communications with their network service providers. Losses of communications may be caused by a variety of problems. For example, a satellite downlink may be temporarily lost, which may cause a loss of communications across a service area. Alternatively, a coaxial cable may be damaged at a single location, which may result in a loss of communications to a single consumer or another network component.

To provide quality network services and to maintain customer satisfaction, service providers may desire restore lost communications as quickly and as efficiently as possible. Conventional systems and methods typically provide a network service provider with only a rough understanding of the area of lost communications, but do not provide detailed insight as to the nature of a given services outage and/or devices that are actually affected. Accordingly, network performance issues on a communications network can be difficult to identify and local or systemic outages can be difficult to pinpoint. In some instances, service interruptions may result from a failure outside of the communications network, but may still cause service issues to communications network hardware. For example, a power outage can affect a significant portion of communications network devices because they are typically powered by the power network. Therefore, identifying external failures allows rapid diagnosis of service issues, improves a communications network's quality of service, and reduces unnecessary service costs.

Therefore, a need exists for improved systems and methods for analyzing the health of networks and identifying potential failures in communications networks or power networks

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral identifies the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Figure 1:
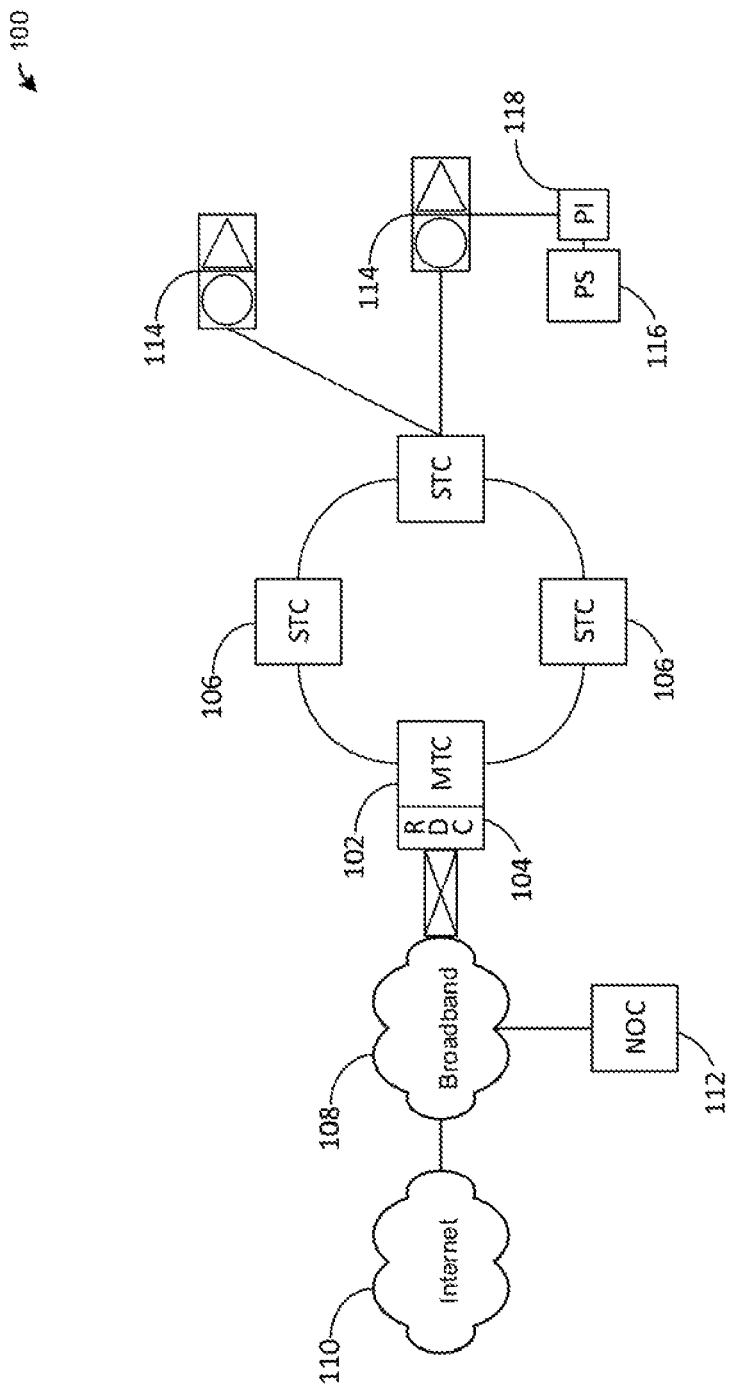
FIG. 1 is a schematic diagram of an illustrative architecture for providing a power outage determination, in accordance with one or more example embodiments of the disclosure.

This disclosure relates to, among other things, a system and associated methods and computer-readable media for power outage determination using cable premise devices.

A provider of network-based services, such as a multiple system operator (MSO), may monitor components of its network, for example to monitor performance of the network-based services. An MSO may provide one or more of video services, data services, voice services, home security services, billing services, application services, web services, and the like. The services may be provided over a network, such as a hybrid fiber-coaxial (HFC) network. To improve the reliability of these services, an MSO may invest in in performance monitoring solutions that allow the MSO to manage active network devices, network power supplies, and in-home customer premise equipment (CPE).

According to some embodiments, a power outage determination system may be able to determine whether a power outage has occurred, as discussed in greater detail below.

According to some embodiments, a power outage determination system may have information indicative of a status of various components of the MSO network. A power outage determination system may leverage this information to determine a point of interest (POI) of a possible power outage. The MSO network may include the HFC network. The MSO network may include various components, including, for example, nodes, power supplies, power inserters, taps, line extenders, amplifiers, CPE devices, and the like. These network components may or may not be monitored. In other words, a power outage determination system may receive information indicative of a status of various components within the MSO network.

According to some embodiments, the power outage determination system may also have information indicative of an orientation of the MSO network. For example, the MSO network may flow from upstream (e.g., from a main telecommunication station (MTC)) to downstream (e.g., to customer homes) along a tree-and-branch configuration. At any given point along the MSO network, the power outage determination system may know the orientation of the MSO network at that point. For example, along the coaxial portion of an HFC network, the power outage determination system may know which direction along a coaxial cable lies a node and which direction along the coaxial cable lies a CPE device.

According to some embodiments, the power outage determination system may know and/or have access to the topology of the power network. For example, at any given point along the power route, the power outage determination system may know the routing and/or the orientation of the power network. In other words, the power network may flow from upstream (e.g., from a commercial power plant and/or substation) to downstream (e.g., to customer homes).

According to some embodiments, the power outage determination system may have access to information associated with only a subset of the homes in the service area. If the MSO services, for example, approximately 50 percent to 60 percent of the service area, information associated with only those homes may be available to a power outage determination system.

According to some embodiments, a power outage determination system may determine that one or more components within the MSO network have lost power. For example, the power outage determination system may receive an indication that a power supply has lost commercial power and is on battery backup.

According to some embodiments, the power outage determination system may determine an orientation of the cable network (e.g., of the MSO network). Based on the orientation of the cable network, the power outage determination system may determine that the outage is power related. For example, various homes that are upstream of the cable network may have lost power, while various homes that are downstream of the cable network may have power. Based on this determination, the power outage determination system may determine that the outage cannot be cable-related, and must therefore be power-related.

According to some embodiments, the power outage determination system may determine an orientation of the power network. If the power outage determination system has access to the routing and orientation of the power network, the power outage determination system may determine that an outage must be power related. For example, various homes that are upstream of the power network may have power, while various homes that are downstream of the power network may have lost power. Based on this determination, the power outage determination system may determine that the outage must be power-related.

According to some embodiments, the power outage determination system may determine a point of interest (POI) based on the topology (e.g., the routing and orientation) of the cable network and/or the topology (e.g., the routing and orientation) of the power network.

According to some embodiments, the power outage determination system may generate a notification based on the determination that the outage is power related and/or on the determination of the POI. The indication (which may include the POI) may be transmitted to one or more recipients, for example via the Internet.

According to some embodiments, a power outage determination system may determine that one or more components within the MSO network have lost connectivity. For example, the power outage determination system may receive an indication that one or more CPE devices have lost cable connectivity.

According to some embodiments, the power outage determination system may determine an orientation of the cable network (e.g., of the MSO network). Based on the orientation of the cable network, the power outage determination system may determine that the outage may be cable related. For example, various homes that are upstream of the cable network may have connectivity, while various homes that are downstream of the cable network may have lost connectivity. Based on this determination, the power outage determination system may determine that the outage may be cable-related.

According to some embodiments, the power outage determination system may determine an orientation of the power network. If the power outage determination system has access to the routing and orientation of the power network, the power outage determination system may determine that an outage must be cable related. For example, various homes that are upstream of the power network may have lost connectivity, while various homes that are downstream of the power network may have connectivity. Based on this determination, the power outage determination system may determine that the outage must be cable-related.

According to some embodiments, the power outage determination system may determine a point of interest (POI) based on the topology (e.g., the routing and orientation) of the cable network and/or the topology (e.g., the routing and orientation) of the power network.

According to some embodiments, the power outage determination system may generate a notification based on the determination that the outage is cable related and/or on the determination of the POI. The indication (which may include the POI) may be transmitted to one or more recipients, for example via the Internet.

According to some embodiments, a power outage determination system may determine that one or more components within the MSO network have lost power and/or connectivity. For example, the power outage determination system may receive an indication that one or more CPE devices have lost power and/or cable connectivity.

According to some embodiments, the power outage determination system may determine an orientation of the cable network (e.g., of the MSO network). Based on the orientation of the cable network, the power outage determination system may determine that the outage may be cable-related. For example, various homes that are upstream of the cable network may have connectivity, while various homes that are downstream of the cable network may have lost connectivity. Based on this determination, the power outage determination system may determine that the outage may be cable-related.

According to some embodiments, the power outage determination system may determine an orientation of the power network. If the power outage determination system has access to the routing and orientation of the power network, the power outage determination system may determine that an outage may be power-related. For example, various homes that are upstream of the power network may have power and/or connectivity, while various homes that are downstream of the power network may have lost power and/or connectivity. Based on this determination, the power outage determination system may determine that the outage may be cable-related or power-related.

According to some embodiments, the power outage determination system may determine to test the reachability of CPE devices that have a battery backup. For example, some CPE devices have an embedded multimedia terminal adapter (eMTA) that may allow the CPE device to be queried regarding its status. According to some devices, the power outage determination system may determine to query a CPE device that has a secondary communication path (e.g., a cellular communication path). The power outage determination system may determine whether the outage is power-related and/or cable-related based on a response to a query of a CPE device.

According to some embodiments, the power outage determination system may determine a point of interest (POI) based on the topology (e.g., the routing and orientation) of the cable network, the topology (e.g., the routing and orientation) of the power network, and/or the status of a CPE device.

According to some embodiments, the power outage determination system may generate a notification based on the determination that the outage is cable related and/or on the determination of the POI. The indication (which may include the POI) may be transmitted to one or more recipients, for example via the Internet.

According to some embodiments, the power outage determination system may use additional information in determining whether an outage is power-related and/or cable-related. For example, the power outage determination system may monitor call volume to the MSO and/or to a commercial power provider to determine whether the outage corresponds to an increase in call volume and/or frequency.

One or more illustrative embodiments of the disclosure have been described above. The above-described embodiments are merely illustrative of the scope of this disclosure and are not intended to be limiting in any way. Accordingly, variations, modifications, and equivalents of embodiments disclosed herein are also within the scope of this disclosure.

The above-described embodiments and additional and/or alternative embodiments of the disclosure will be described in detail hereinafter through reference to the accompanying drawings.

FIG. 1 is a schematic diagram of an illustrative architecture for providing a power outage determination, in accordance with one or more example embodiments of the disclosure.

A provider of network-based services, such as a multiple system operator (MSO), may provide one or more services to customers. For example, an MSO may provide one or more of video services, data services, voice services, home security services, billing services, application services, web services, and the like. The services may be provided over a network operated by the MSO, such as a hybrid fiber-coaxial (HFC) network. To improve the reliability of these services, an MSO may monitor performance of the services provided, for example by managing active network devices, network power supplies, and in-home customer premise equipment (CPE).

According to some embodiments, an MSO may leverage information generated during the provision of services over a network to make a power outage determination. A power outage determination system 100 may include a master telecommunication center (MTC) 102, a regional data center (RDC) 104, and a secondary telecommunication center (STC) 106. The MTC 102, RDC 104, and STC 106 may receive and/or generate video signals (e.g., video content for subscribers) and may encode, modulate, and/or upconvert the video signals onto radio frequency (RF) carriers and may insert an electrical signal into a broadband optical transmitter. In other words, the MTC 102, RDC 104, and/or STC 106 may provide one or more services to customers, wherein the one or more services may include video signals that are transmitted to the customers over an MSO network, such as a HFC network.

As noted above, an MSO may monitor performance of the services provided, for example by managing active network devices, network power supplies, and in-home CPEs. A network may be monitored by a network operations center (NOC) 112. The NOC 112 (or "network management center") may be responsible for monitoring one or more aspects of the MSO network, including, for example, power failures, communication line alarms (for example, alarms indicative of one or more of bit errors, framing errors, line coding errors, circuits down, and the like) and other performance issues that may affect the MSO network. The NOC 112 may include a power outage determination system that may determine whether and/or where a power outage has occurred within an area in which the MSO operates and/or monitors. The NOC 112 may communicate with one or more of the MTC 102, the RDC 104, and one or more STCs 106 via broadband network 108 and/or the Internet 110.

According to some embodiments, an MSO may provide one or more services to customers, wherein the one or more services may include video signals that are transmitted to the customers over an MSO network (e.g., an HFC network). The signals may be transmitted from an MTC 102 and/or an STC 106 to a node 114. The node 114 (e.g., a fiber optic node) may include a broadband optical receiver, which may convert the downstream optically modulated signal coming from the headend or hub (e.g., from MTC 102 and/or from STC 106) to an electrical signal going to the homes. The node 1114 may transmit the converted signal over a coaxial cable. The node 114 may also contain a reverse- or return-path transmitter that may send communications upstream (e.g., from a home back to the headend). For example, the node 114 may transmit information indicative of a status of one or more components of the network, such as a status of the node 114, a power supply 116, and/or a CPE. A status of the node 114 may be monitored. For example, a status of the node 114 may indicate whether or not the node is receiving power, along with additional information relative to the performance of the node 114. For example, status monitoring equipment at the node 114 may provide information that is descriptive of the network (e.g., optical light levels, RF characteristics, etc.) and/or of the power levels at the node 114. Information indicative of a status of the node 114 may be transmitted to the NOC 112.

A node 114 may serve anywhere from 25 to 2000 homes (or households passed (HHP)). For example, a typical node 114 may serve approximately 500 HHP, although other numbers are also contemplated within the scope of this disclosure. A node 114 may have a single coaxial line or a plurality of coaxial lines connected to the node 114. For example, a node 114 may have four coaxial lines (or "legs") that may carry signals downstream from the MTC 102 and/or from an STC 106 to homes that the node 114 serves. The coaxial lines may also transmit power. For example, in addition to the RF signals transmitted over the coaxial lines, the coaxial lines may also transmit power at a certain voltage (e.g., approximately 90 volts).

According to some embodiments, system 100 may include a power supply 116 and a power inserter 118. The power supply 116 may provide power (e.g., commercial power supplied by a commercial power supplier) to one or more components within the network operated by an MSO. For example, a power supply 116 may provide power to a node 114. Note that more than one power supply 116 may serve a single node. For example, a 500 HPP node may have two, three, or four power supplies that serve that node. According to some embodiments, a power supply 116 may provide power to an amplifier. The power supply 116 may be used to ensure that the voltage at any point within the network does not fall below a certain threshold. A status of the power supply 116 may be monitored. For example, a status of the power supply 116 may indicate whether or not the power supply 116 is receiving commercial power, along with additional information relative to the performance of the power supply 116. For example, power supply information indicative of a remaining battery life, current draw, max current rating, and/or output voltage may be determined. For example, a power supply 116 may indicate an amount of backup power remaining after commercial power supply has been lost. Information indicative of a status of the power supply 116 may be transmitted to the NOC 112 (e.g., along the MSO network, which may be an HFC network).

According to some embodiments, the power supply 116 may have a backup source of power. In other words, in addition to the commercial power that power supply 116 may be connected to, the power supply 116 may have one or more of a battery backup and/or a backup generator. The backup power to which the power supply 116 may have access may be limited in terms of the amount of time that the backup power may be provided to the power supply 116. For example, in the event of a loss of commercial power, a power supply 116 may have a backup battery or a backup generator that is able to provide power to the power supply 116 for only a limited amount of time (e.g., anywhere from 1 hour to 48 hours). A typical power supply 116 may have approximately eight hours of backup power.

According to some embodiments, the power supplied by the power supply 116 may be mediated by power inserter 118. For example, power supply 116 may be electrically coupled to power supply 118, which may be electrically coupled to node 114 (e.g., in order to supply power to node 114). The power supply 116 may modify a voltage of the power received by the power supply 116. According to some embodiments, power supply 116 may receive power at a first voltage (e.g., at 240 volts) and may transmit power at a second voltage that is different from the first voltage (e.g., at 90 volts).

It is understood that the above descriptions are for purposes of illustration and are not meant to be limiting.

Figure 2:
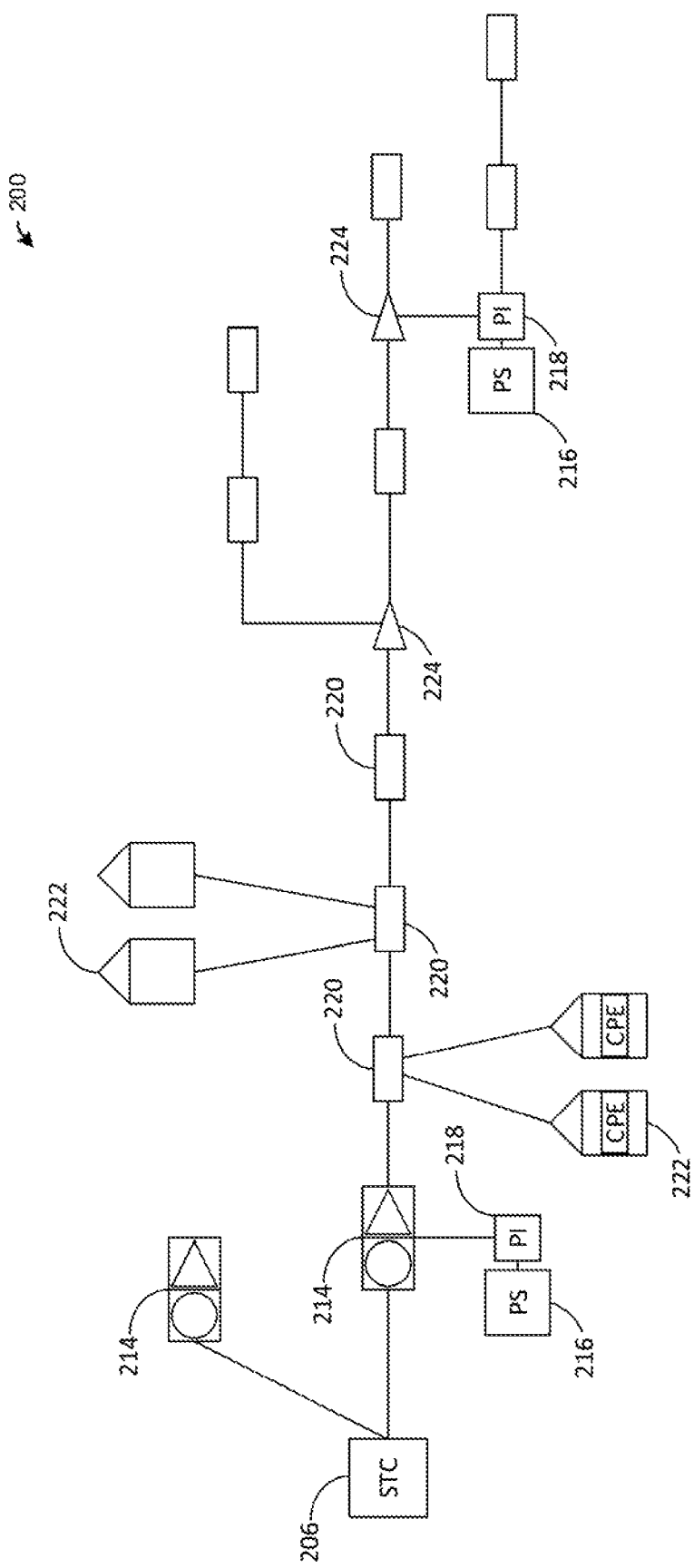
FIG. 2 is a schematic diagram of an illustrative architecture for providing a power outage determination, in accordance with one or more example embodiments of the disclosure.

FIG. 2 is a schematic diagram of an illustrative architecture for providing a power outage determination, in accordance with one or more example embodiments of the disclosure.

According to some embodiments, an MSO may provide one or more services to customers over an MSO network. For example, the MSO may provide one or more of video services, data services, voice services, home security services, billing services, application services, web services, and the like. The one or more services may include video signals that are transmitted from an STC 206 over an HFC network to a node 214. According to some embodiments, STC 206 may correspond to STC 106 of FIG. 1 and node 214 may correspond to node 114 of FIG. 1. The power outage determination system 200 may be a continuation of the power outage determination system 100 of FIG. 1.

As noted above, an MSO may provide one or more services to customers 222, wherein the one or more services may include video signals that are transmitted to the customers 222 over an MSO network (e.g., an HFC network). The signals may be transmitted from an MTC and/or an STC 206 to a node 214. The node 214 (e.g., a fiber optic node) may convert the downstream optically modulated signal coming from the headend or hub to an electrical signal going to the homes 222 and may transmit the converted signal over a coaxial cable. The node 214 may be powered by at least one power supply, such as power supply 216, which may transmit the supplied power via power inserter 218.

According to some embodiments, the node 214 may serve approximately 500 HPP. In other words, the node 214 may transmit a signal (e.g., a video signal) over an MSO network that include one or more coaxial cable lines that may extend downstream from the node 214. As illustrated in FIG. 2, node 214 includes a single downstream coaxial cable line. Note that the illustrated embodiment is not meant to be limiting, and a node 214 may include a plurality of coaxial cable lines that extend downstream from the node 214. The coaxial portion of the network may connect the approximately 25 to 2000 homes served by the node 214 in a tree-and-branch configuration off of the node. Amplifiers 224 (e.g., RF amplifiers) and line extenders may be used at intervals, for example to overcome cable attenuation and passive losses of the electrical signals (which may be caused by tapping (e.g., splitting) the coaxial cable and/or by resistive losses).

According to some embodiments, a coaxial cable line that extends from the node 214 may include one or more taps 220. The taps 220 may be used to retrieve a signal from the distribution line and to connect individual drops to customer homes 222. A single tap 220 may serve anywhere from one to five houses 222, although an additional number of houses 222 is contemplated by this disclosure. According to some embodiments, the taps 220 may pass the RF signal to a coaxial drop within the customer home 222.

The customer home 222 may include a CPE device. A customer home 222 may include any number of CPE devices. A CPE device may include, for example, one or more of cable set-top boxes, cable modems, telephony modems, gateway devices, computer devices, and the like. A CPE device may or may not be Data Over Cable Service Interface Specification (DOCSIS)-based device. Any one of these CPE device types may represent an endpoint in the MSO network.

According to some embodiments, a CPE device may have a battery backup. In other words, a CPE device may include an alternative source of temporary power that is available in the event that the CPE device experiences external power loss. The CPE device may be able to communicate over the coaxial portion of the MSO network. According to some embodiments, some CPE devices may have an additional communication pathway via which the CPE device may communicate with network operators (e.g., with NOC 112 of FIG. 1). For example, a CPE device may have access to a cellular communication path, which may include voice and/or data communications. The CPE device may be able to communicate with network operators in the event of power loss (e.g., if the CPE has a battery backup) and/or in the event of cable communication loss (e.g., if the CPE has access to a secondary communication pathway, such as a cellular communication pathway).

According to some embodiments, a CPE device may be analyzed as to the status of the device. In other words, a status of the CPE device may be monitored. For example, a status of the CPE device may indicate whether or not the CPE device is receiving power, along with additional information relative to the performance of the CPE device. For example, CPE device information indicative of an online/offline status and/or RF metrics (e.g., transmit, receive, signal to noise ratio, error bit counts, bonded/unbonded channels, etc.) may be determined. Additionally, a CPE device may indicate whether or not the CPE device can communicate via the cable communication path. Information indicative of a status of the CPE device may be transmitted to the NOC 112 (e.g., along the MSO network, which may be an HFC network).

It is understood that the above descriptions are for purposes of illustration and are not meant to be limiting.

FIGS. 3A-3D are schematic diagrams illustrating examples of scenarios for a power outage determination, in accordance with one or more example embodiments of the disclosure.

Figure 3A:
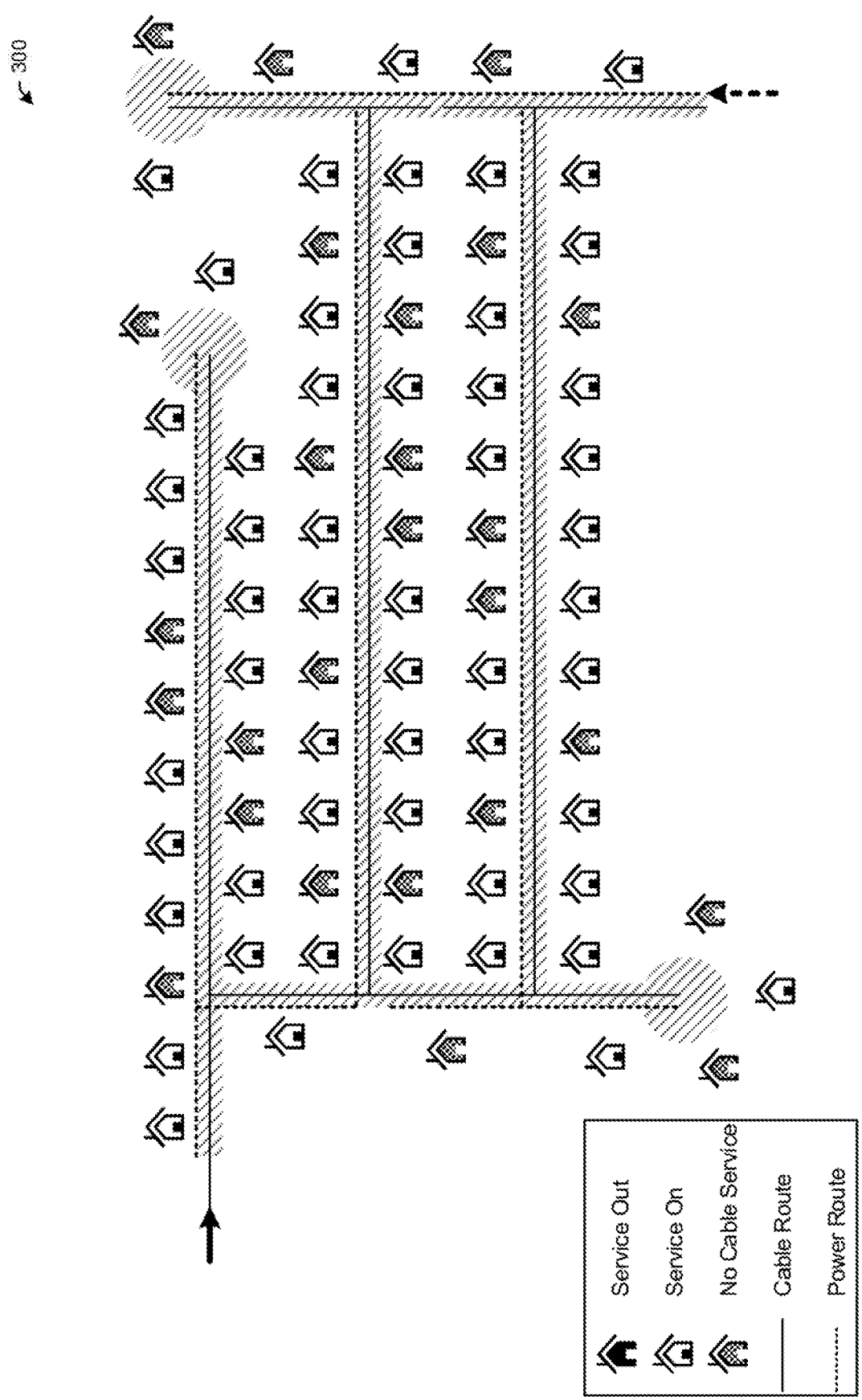
FIGS. 3A-3D are schematic diagrams illustrating examples of scenarios for a power outage determination, in accordance with one or more example embodiments of the disclosure.

FIG. 3A is a schematic diagram illustrating an example of a scenario of a healthy service area, in accordance with one or more example embodiments of the disclosure.

According to some embodiments, a power outage determination system may have information indicative of a status of various components of the MSO network. A power outage determination system may leverage this information to determine a point of interest (POI) of a possible power outage. The MSO network may include the HFC network described above with respect to FIGS. 1-2. The MSO network may include various components, including, for example, nodes (e.g., nodes 114 of FIG. 1 and nodes 214 of FIG. 2), power supplies (e.g., power supplies 116 of FIG. 1 and 216 of FIG. 2), power inserters (e.g., power inserters 118 of FIGS. 1 and 218 of FIG. 2), taps (e.g., taps 220 of FIG. 2), line extenders, amplifiers (e.g., amplifiers 224 of FIG. 2), CPE devices, and the like. These network components may or may not be monitored. In other words, a power outage determination system may receive information indicative of a status of various components within the MSO network.

According to some embodiments, the power outage determination system may also have information indicative of an orientation of the MSO network. For example, the MSO network may flow from upstream (e.g., from MTC 102 and/or STC 106 of FIG. 1) to downstream (e.g., to customer homes 222 of FIG. 2) along a tree-and-branch configuration. At any given point along the MSO network, the power outage determination system may know the orientation of the MSO network at that point. For example, along the coaxial portion of an HFC network, the power outage determination system may know which direction along a coaxial cable lies a node and which direction along the coaxial cable lies a CPE device. As illustrated in FIG. 3A, the cable service routing and orientation is indicated with the solid line.

According to some embodiments, the power outage determination system may know and/or have access to the topology of the power network. For example, at any given point along the power route, the power outage determination system may know the routing and/or the orientation of the power network. In other words, the power network may flow from upstream (e.g., from a commercial power plant and/or substation) to downstream (e.g., to customer homes). As illustrated in FIG. 3A, the power service routing and orientation is indicated with the dashed line.

As illustrated in FIG. 3A, the power outage determination system may have access to information associated with only a subset of the homes in the service area. If the MSO services, for example, approximately 50 percent to 60 percent of the service area, information associated with only those homes may be available to a power outage determination system.

It is understood that the above descriptions are for purposes of illustration and are not meant to be limiting.

Figure 3B:
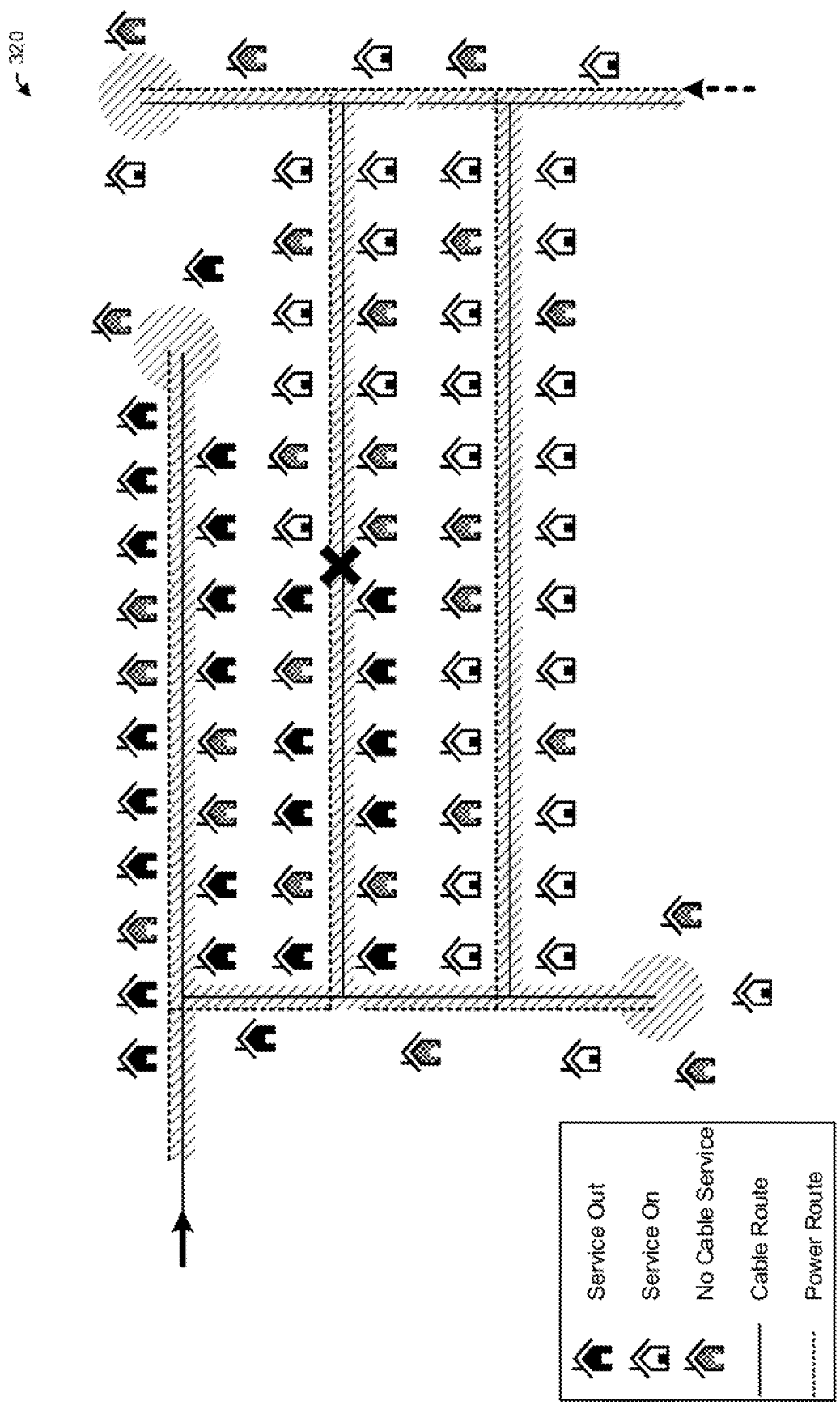

FIG. 3B is a schematic diagram illustrating an example of a scenario of a power outage in a service area, in accordance with one or more example embodiments of the disclosure.

According to some embodiments, a power outage determination system may determine that one or more components within the MSO network have lost power. For example, the power outage determination system may receive an indication that a power supply (e.g., power supply 216 of FIG. 2) has lost commercial power and is on battery backup.

According to some embodiments, the power outage determination system may determine an orientation of the cable network (e.g., of the MSO network). As illustrated in FIG. 3B, the cable route is indicated with the solid line. Based on the orientation of the cable network, the power outage determination system may determine that the outage is power related. For example, in the illustrated embodiment, various homes that are upstream of the cable network have lost power, while various homes that are downstream of the cable network have power. Based on this determination, the power outage determination system may determine that the outage cannot be cable-related, and must therefore be power-related.

According to some embodiments, the power outage determination system may determine an orientation of the power network. As illustrated in FIG. 3B, the power route is indicated with the dashed line. If the power outage determination system has access to the routing and orientation of the power network, the power outage determination system may determine that an outage must be power related. For example, in the illustrated embodiment, various homes that are upstream of the power network have power, while various homes that are downstream of the power network have lost power. Based on this determination, the power outage determination system may determine that the outage must be power-related.

According to some embodiments, the power outage determination system may determine a point of interest (POI) based on the topology (e.g., the routing and orientation) of the cable network and/or the topology (e.g., the routing and orientation) of the power network. For example, as illustrated in FIG. 3B, the power outage determination system may determine that the POI is located on the service area marked with an "X."

According to some embodiments, the power outage determination system may generate a notification based on the determination that the outage is power related and/or on the determination of the POI. The indication (which may include the POI) may be transmitted to one or more recipients, for example via the Internet 110 of FIG. 1.

It is understood that the above descriptions are for purposes of illustration and are not meant to be limiting.

Figure 3C:
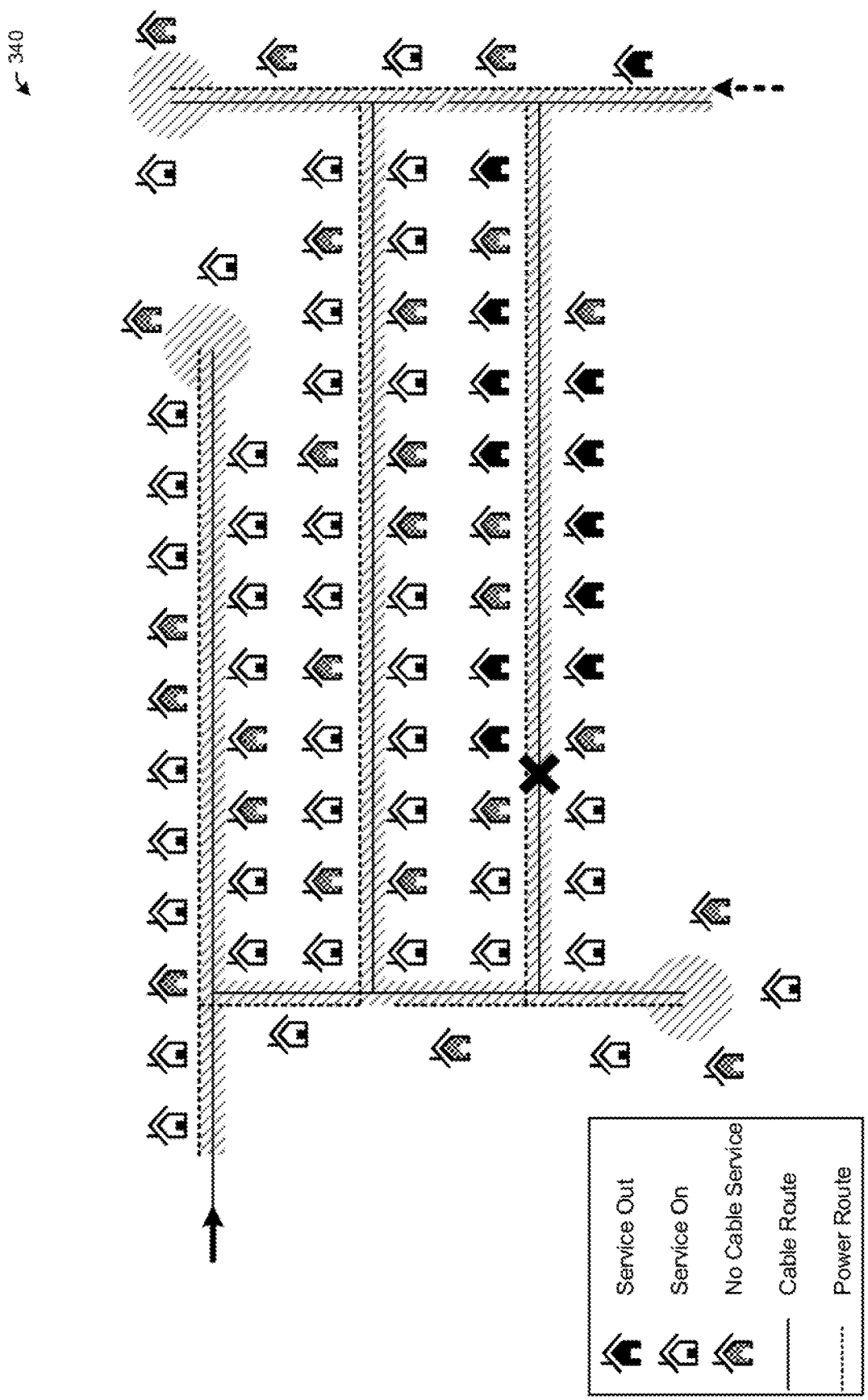

FIG. 3C is a schematic diagram illustrating an example of a scenario of a cable outage in a service area, in accordance with one or more example embodiments of the disclosure.

According to some embodiments, a power outage determination system may determine that one or more components within the MSO network have lost connectivity. For example, the power outage determination system may receive an indication that one or more CPE devices have lost cable connectivity.

According to some embodiments, the power outage determination system may determine an orientation of the cable network (e.g., of the MSO network). As illustrated in FIG. 3C, the cable route is indicated with the solid line. Based on the orientation of the cable network, the power outage determination system may determine that the outage may be cable related. For example, in the illustrated embodiment, various homes that are upstream of the cable network have connectivity, while various homes that are downstream of the cable network have lost connectivity. Based on this determination, the power outage determination system may determine that the outage may be cable-related.

According to some embodiments, the power outage determination system may determine an orientation of the power network. As illustrated in FIG. 3C, the power route is indicated with the dashed line. If the power outage determination system has access to the routing and orientation of the power network, the power outage determination system may determine that an outage must be cable related. For example, in the illustrated embodiment, various homes that are upstream of the power network have lost connectivity, while various homes that are downstream of the power network have connectivity. Based on this determination, the power outage determination system may determine that the outage must be cable-related.

According to some embodiments, the power outage determination system may determine a point of interest (POI) based on the topology (e.g., the routing and orientation) of the cable network and/or the topology (e.g., the routing and orientation) of the power network. For example, as illustrated in FIG. 3C, the power outage determination system may determine that the POI is located on the service area marked with an "X."

According to some embodiments, the power outage determination system may generate a notification based on the determination that the outage is cable related and/or on the determination of the POI. The indication (which may include the POI) may be transmitted to one or more recipients, for example via the Internet 110 of FIG. 1.

It is understood that the above descriptions are for purposes of illustration and are not meant to be limiting.

Figure 3D:
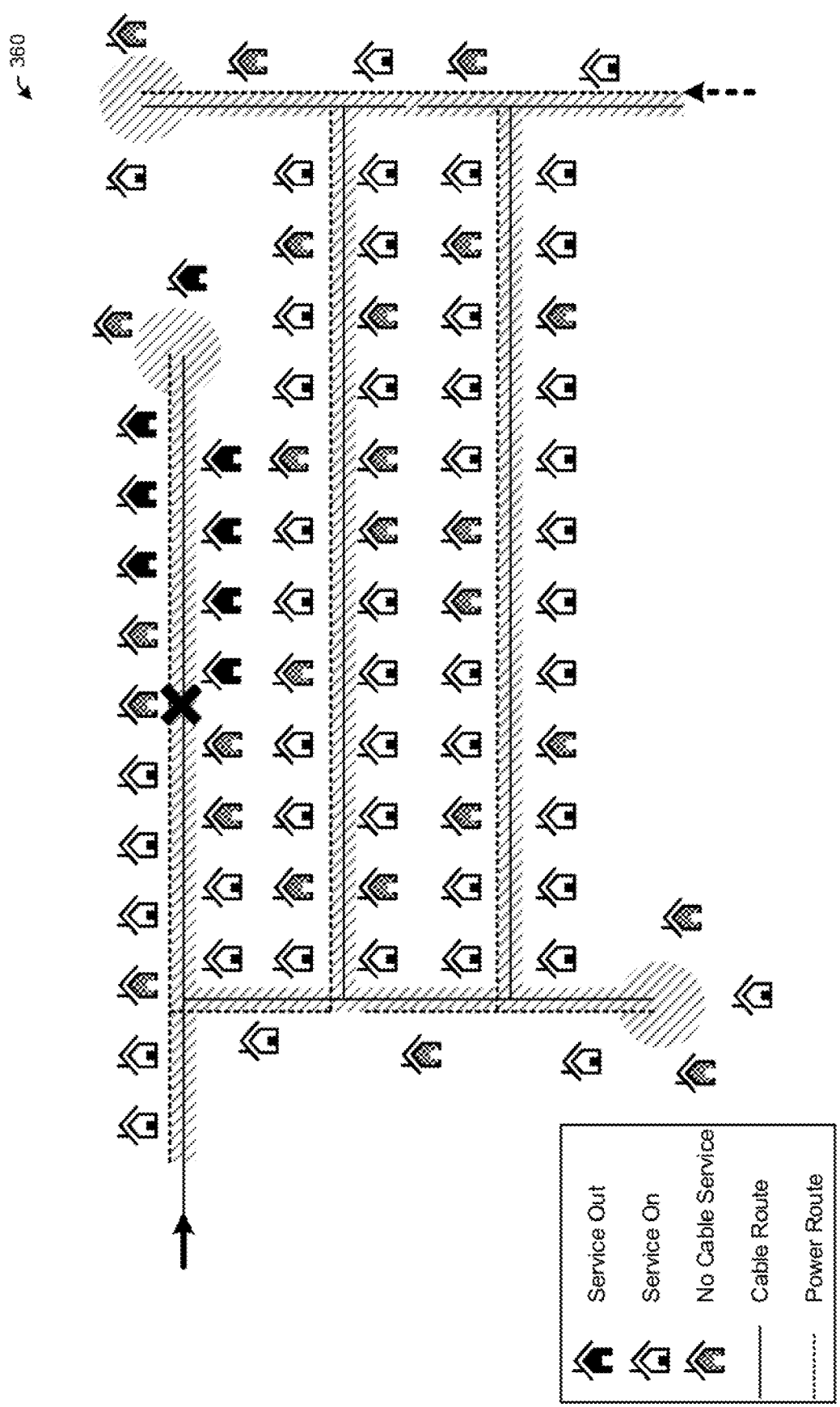

FIG. 3D is a schematic diagram illustrating an example of a scenario of an outage in a service area, in accordance with one or more example embodiments of the disclosure.

According to some embodiments, a power outage determination system may determine that one or more components within the MSO network have lost power and/or connectivity. For example, the power outage determination system may receive an indication that one or more CPE devices have lost power and/or cable connectivity.

According to some embodiments, the power outage determination system may determine an orientation of the cable network (e.g., of the MSO network). As illustrated in FIG. 3D, the cable route is indicated with the solid line. Based on the orientation of the cable network, the power outage determination system may determine that the outage may be cable-related. For example, in the illustrated embodiment, various homes that are upstream of the cable network have connectivity, while various homes that are downstream of the cable network have lost connectivity. Based on this determination, the power outage determination system may determine that the outage may be cable-related.

According to some embodiments, the power outage determination system may determine an orientation of the power network. As illustrated in FIG. 3D, the power route is indicated with the dashed line. If the power outage determination system has access to the routing and orientation of the power network, the power outage determination system may determine that an outage may be power-related. For example, in the illustrated embodiment, various homes that are upstream of the power network have power and/or connectivity, while various homes that are downstream of the power network have lost power and/or connectivity. Based on this determination, the power outage determination system may determine that the outage may be cable-related or power-related.

According to some embodiments, the power outage determination system may determine to test the reachability of CPE devices that have a battery backup. For example, some CPE devices have an embedded multimedia terminal adapter (eMTA) that may allow the CPE device to be queried regarding its status. According to some devices, the power outage determination system may determine to query a CPE device that has a secondary communication path (e.g., a cellular communication path). The power outage determination system may determine whether the outage is power-related and/or cable-related based on a response to a query of a CPE device.

According to some embodiments, the power outage determination system may determine a point of interest (POI) based on the topology (e.g., the routing and orientation) of the cable network, the topology (e.g., the routing and orientation) of the power network, and/or the status of a CPE device. For example, as illustrated in FIG. 3C, the power outage determination system may determine that the POI is located on the service area marked with an "X."

According to some embodiments, the power outage determination system may generate a notification based on the determination that the outage is cable related and/or on the determination of the POI. The indication (which may include the POI) may be transmitted to one or more recipients, for example via the Internet 110 of FIG. 1.

According to some embodiments, the power outage determination system may use additional information in determining whether an outage is power-related and/or cable-related. For example, the power outage determination system may monitor call volume to the MSO and/or to a commercial power provider to determine whether the outage corresponds to an increase in call volume and/or frequency.

It is understood that the above descriptions are for purposes of illustration and are not meant to be limiting.

Illustrative Device Architecture

Figure 4:
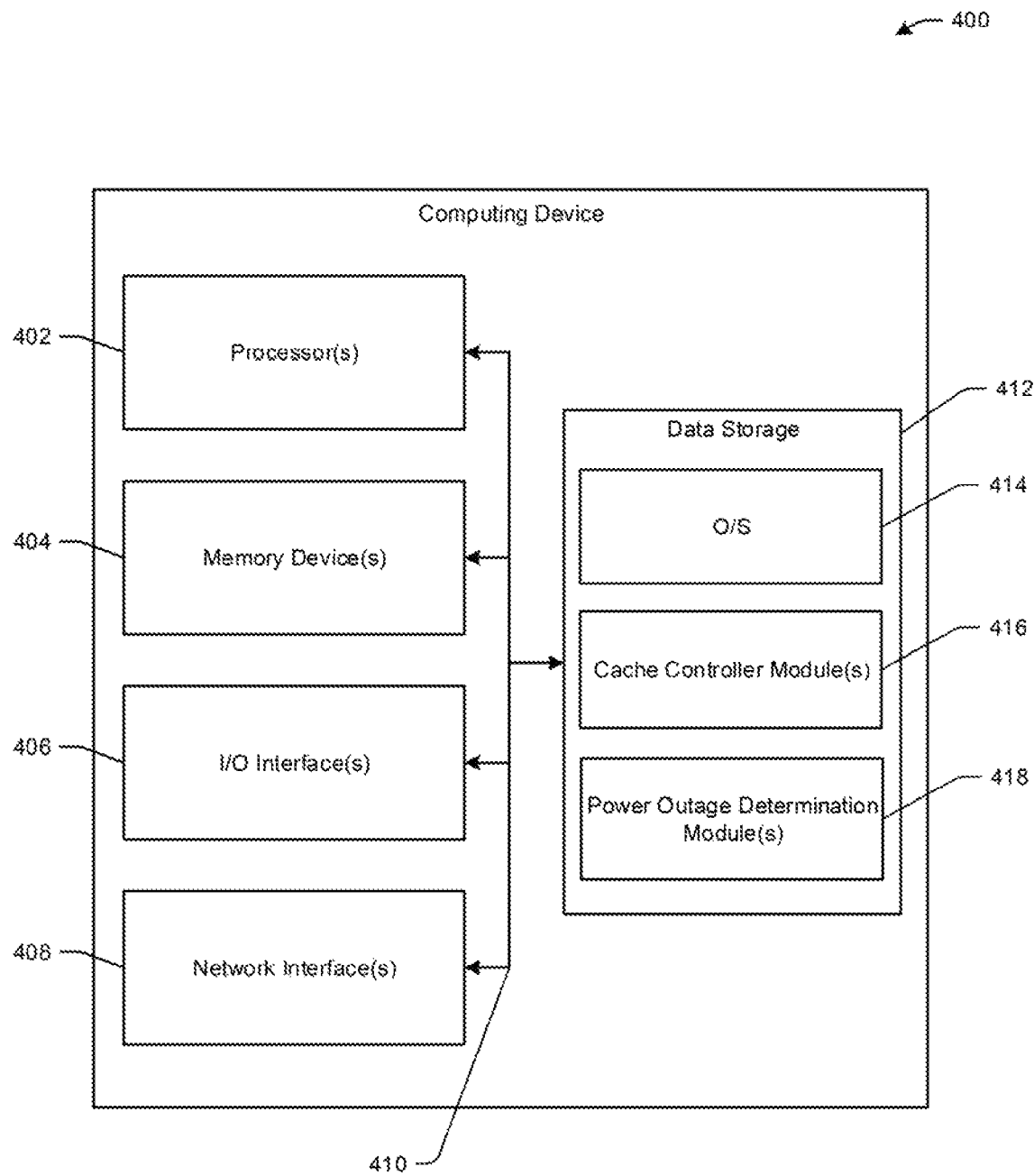
FIG. 4 is a schematic block diagram of an example computing device of a power outage determination system, in accordance with one or more example embodiments of the disclosure.

FIG. 4 is a schematic block diagram of an example computing device of a network-based services system, in accordance with one or more example embodiments of the disclosure. In an illustrative configuration, the device 400 (e.g., a device within NOC 112 of FIG. 1) may include one or more processors (processor(s)) 402, one or more memory devices 404 (generically referred to herein as memory 404), one or more input/output ("I/O") interface(s) 406, one or more network interfaces 408, and data storage 412. The device 400 may further include one or more buses 410 that may functionally couple various components of the device 400. These various components will be described in more detail hereinafter.

The bus(es) 410 may include at least one of a system bus, a memory bus, an address bus, or a message bus, and may permit exchange of information (e.g., data (including computer-executable code), signaling, etc.) between various components of the device 400. The bus(es) 410 may have any of a variety of bus structures including, without limitation, a memory bus or a memory controller, a peripheral bus, an accelerated graphics port, and so forth. The bus(es) 410 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, a Serial Peripheral Interface architecture, and so forth.

The memory 404 of the device 400 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 404 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 404 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 412 may include removable storage and/or non-removable storage including, but not limited to, magnetic storage, optical disk storage, and/or tape storage. The data storage 412 may include, for example, memory cards, USB flash drives, external hard disk drives, optical discs, and so forth. The data storage 412 may provide non-volatile storage of computer-executable instructions and other data. The memory 404 and the data storage 412, removable and/or non-removable, are examples of computer-readable storage media (CRSM) as that term is used herein.

The data storage 412 may store computer-executable code, instructions, or the like that may be loadable into the memory 404 and executable by the processor(s) 402 to cause various operations to be performed. In certain example embodiments, computer-executable code stored in the data storage 412 may be executable by the processor(s) 402 directly from the data storage 402. The data storage 412 may additionally store data that may be copied to memory 404 for use by the processor(s) 402 during the execution of the computer-executable instructions. Moreover, output data generated as a result of execution of the computer-executable instructions by the processor(s) 402 may be stored initially in memory 404, and may ultimately be copied to data storage 412 for non-volatile storage.

More specifically, the data storage 412 may store one or more operating systems (O/S) 414; one or more cache controller module(s) 416; and one or more power outage determination module(s) 418. Any of the modules depicted in FIG. 4 may include computer-executable code, instructions, or the like that may be loaded into the memory 404 for execution by one or more of the processor(s) 402.

The processor(s) 402 may be configured to access the memory 404 and execute computer-executable instructions loaded therein. For example, the processor(s) 402 may be configured to execute one or more computer-executable instructions of the various program modules of the device 400 to cause and/or facilitate various operations to be performed in accordance with one or more embodiments of the disclosure. The processor(s) 402 may include any suitable processing unit capable of accepting data as input, processing the input data in accordance with stored computer-executable instructions, and generating output data. The processor(s) 402 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 402 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 402 may be capable of supporting any of a variety of instruction sets.

Referring now to functionality that may be supported by the various program modules depicted as being stored in the data storage 412, the cache controller module(s) 416; and/or the power outage determination module(s) 418 may include computer-executable code, instructions, or the like for power outage determination.

Referring now to other illustrative components depicted in FIG. 4 as being stored in the data storage 412, the O/S 414 may be loaded from the data storage 412 into the memory 404 and may provide an interface between other application software executing on the device 400 and hardware resources of the device 400. More specifically, the O/S 414 may include a set of computer-executable instructions for managing hardware resources of the device 400 and for providing common services to other application programs (e.g., managing memory allocation among various application programs). The O/S 414 may include any operating system now known or which may be developed in the future including, but not limited to, any proprietary or non-proprietary operating system (e.g., a Linux based operating system).

Referring now to other illustrative components of the device 400, one or more input/output (I/O) interfaces 406 may be provided that may facilitate the receipt of input information by the device 400 from one or more I/O devices as well as the output of information from the device 400 to the one or more I/O devices. The I/O devices may include, for example, one or more user interface devices that facilitate interaction between a user and the device 400 including, but not limited to, a display, a keypad, a pointing device, a control panel, a touch screen display, a remote control device, a microphone, a speaker, and so forth. The I/O devices may further include, for example, any number of peripheral devices such as data storage devices, printing devices, and so forth. The device 400 may further include one or more network interfaces 408 via which the device 400 may communicate with any of a variety of other systems, platforms, networks, devices, and so forth. The input/output interface(s) 406 and/or the network interface(s) 408 may include or otherwise facilitate communication via any of a variety of types of serial or parallel ports including, without limitation, an Ethernet port, a USB port, a High-Definition Multimedia Interface (HDMI) port, a Video Graphics Array (VGA) port, a coaxial RF connector (female), and so forth.

The network interface(s) 408 may facilitate communication between the device 400 and one or more other devices via any suitable type of network. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

It should be appreciated that the program modules, applications, computer-executable instructions, code, or the like depicted in FIG. 4 as being stored in the data storage 412 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the device 400, and/or hosted on other computing device(s) accessible via one or more networks, may be provided to support functionality provided by the program modules, applications, or computer-executable code depicted in FIG. 4 and/or additional or alternate functionality. Further, functionality may be modularized differently such that processing described as being supported collectively by the collection of program modules depicted in FIG. 4 may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 4 may be implemented, at least partially, in hardware and/or firmware across any number of devices.

It should further be appreciated that the device 400 may include alternate and/or additional hardware, software, or firmware components beyond those described or depicted without departing from the scope of the disclosure. More particularly, it should be appreciated that software, firmware, or hardware components depicted as forming part of the device 400 are merely illustrative and that some components may not be present or additional components may be provided in various embodiments. While various illustrative program modules have been depicted and described as software modules stored in data storage, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Illustrative Processes

Figure 5:
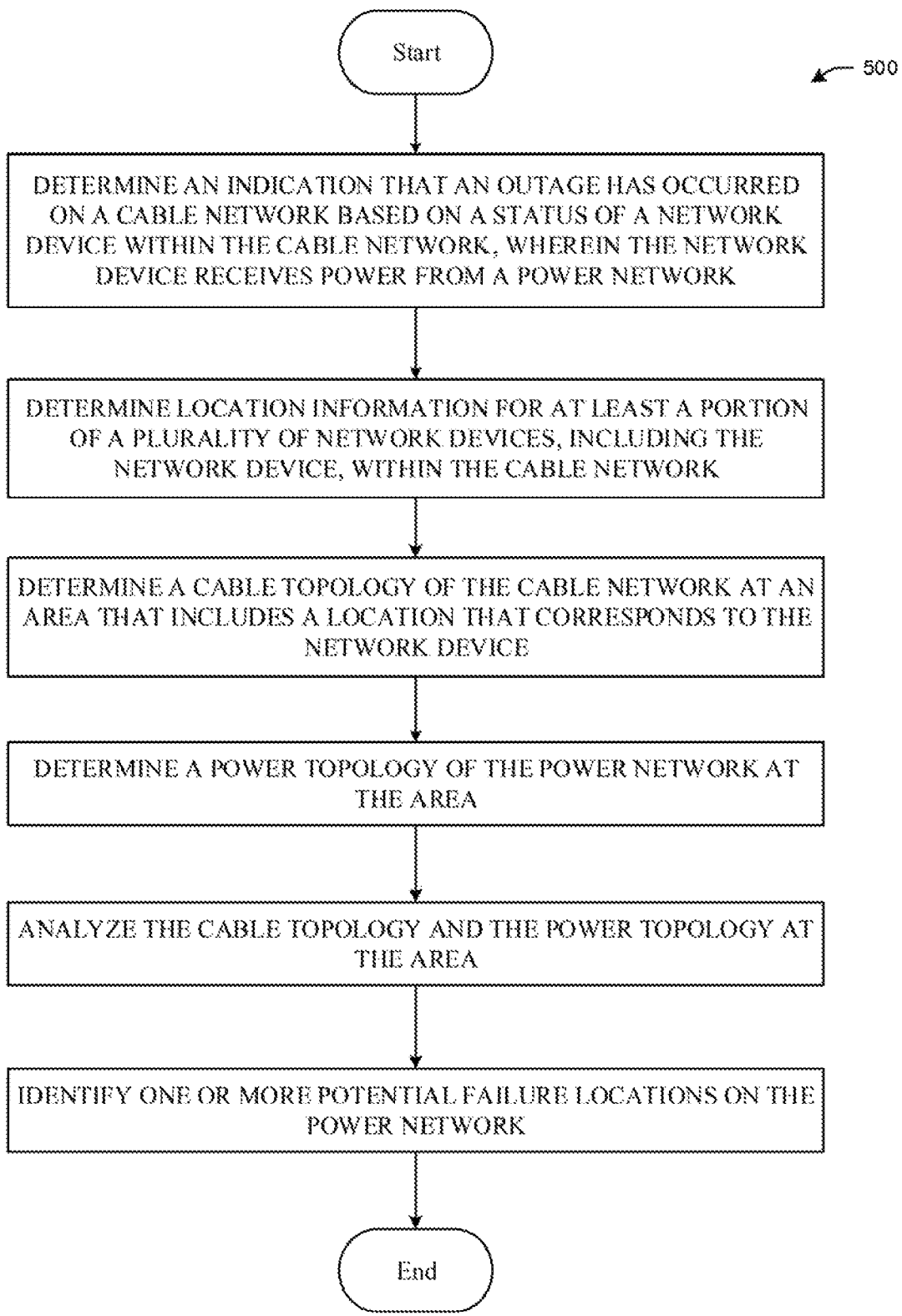
FIG. 5 is a process flow diagram of an illustrative method for providing a power outage determination, in accordance with one or more example embodiments of the disclosure.

FIG. 5 is a process flow diagram of an illustrative method for power outage determination, in accordance with one or more example embodiments of the disclosure.

At block 502, a first device may determine an indication that an outage has occurred on a cable network based on a status of a network device within the cable network, wherein the network device receives power from a power network.

At block 504, the first device may determine location information for at least a portion of a plurality of network devices, including the network device, within the cable network.

At block 506, the first device may determine a cable topology of the cable network at an area that includes a location that corresponds to the network device.

At block 508, the first device may determine a power topology of the power network at the area.

At block 510, the first device may analyze the cable topology and the power topology at the area.

At block 512, the first device may identify one or more potential failure locations on the power network.

One or more operations of method 500 may have been described as being performed by one or more components of a system, such as system 100 of FIG. 1 and/or system 200 of FIG. 2, or more specifically, by one or more program modules executing on such components. It should be appreciated, however, that any of the operations of method 500 described as being performed by a particular component or a particular program module executing thereon may be performed by another component or another program module executing thereon. In addition, it should be appreciated that processing performed in response to execution of computer-executable instructions provided as part of an application, program module, or the like may be described herein as being performed by the application or the program module itself, by a device on which the application, program module, or the like is executing, or by a system that includes such a device. While the operations of method 500 are described in the context of the illustrative system 100 and/or system 200, it should be appreciated that the method may be implemented in connection with numerous other architectural and device level configurations.

In addition, it should be appreciated that the operations described and depicted in FIG. 5 may be carried out or performed in any suitable order as desired in various embodiments of the disclosure. Additionally, in certain embodiments, at least a portion of the operations may be carried out in parallel. Furthermore, in certain embodiments, less, more, or different operations than those depicted in FIG. 5 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program modules, applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers), data storage (e.g., file management) routines, other common routines and services, etc.), or third-party software components (e.g., middleware, encryption or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may also invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A method, comprising:
   determining, by one or more processors, an indication that an outage has occurred on a cable network based on a status of a network device within the cable network, wherein the network device receives power from a power network;
   determining, by the one or more processors, location information for at least a portion of a plurality of network devices, including the network device, within the cable network;
   determining, by the one or more processors, a cable topology of the cable network at an area that includes a location that corresponds to the network device, wherein the cable topology of the cable network includes a routing and an orientation of the cable network;
   determining, by the one or more processors, a power topology of the power network at the area;
   analyzing, by the one or more processors, the cable topology and the power topology at the area; and
   identifying, by the one or more processors, based on the routing, the orientation, and the power topology, one or more potential failure locations on the power network.

2. The method of claim 1, further comprising:
   determining, by the one or more processors, a status of a customer premise equipment (CPE) device within the area,
   wherein the one or more potential failure locations are further based on the status of the CPE device.

3. The method of claim 1, wherein analyzing the cable topology and the power topology comprises identifying one or more power network components that are proximate to area.

4. The method of claim 1, wherein analyzing the cable topology and the power topology comprises identifying one or more power network components that are located upstream of the network device.

5. The method of claim 1, further comprising:
   determining, by the one or more processors, customer addresses for the area;
   locating, by the one or more processors, the customer addresses on the power topology; and
   identifying, by the one or more processors, at least one power network component located on the power network upstream from the customer addresses as the one or more potential failure locations.

6. The method of claim 1, wherein the network device is configured to receive power from the power network, and wherein the indication includes an indication that the network device is not receiving power from the power network.

7. The method of claim 1, wherein analyzing the cable topology and the power topology comprises associating addresses for one or more of the plurality of network devices with a power topology map.

8. The method of claim 1, wherein determining the indication of the outage comprises determining that the network device is not being powered by the power network but is being powered by a battery back-up.

9. The method of claim 1, wherein determining the indication of the outage comprises identifying at least one customer endpoint with a first network device that does not have battery back-up capabilities having an inactive status and a second network device with battery back-up capabilities having an active status.

10. A system, comprising:
    a memory storing computer-executable instructions; and
    at least one processor in communication with the memory and operable to execute the computer-executable instructions to:
    determining, by one or more processors, an indication that an outage has occurred on a cable network based on a status of a network device within the cable network, wherein the network device receives power from a power network;
    determining, by the one or more processors, location information for at least a portion of a plurality of network devices, including the network device, within the cable network;
    determining, by the one or more processors, a cable topology of the cable network at an area that includes a location that corresponds to the network device, wherein the cable topology of the cable network includes a routing and an orientation of the cable network;
    determining, by the one or more processors, a power topology of the power network at the area;
    analyzing, by the one or more processors, the cable topology and the power topology at the area; and
    identifying, by the one or more processors, based on the routing, the orientation, and the power topology, one or more potential failure locations on the power network.

11. The system of claim 10, wherein the processor is further operable to execute the computer-executable instructions to:
    determining a status of a customer premise equipment (CPE) device within the area,
    wherein the one or more potential failure locations are further based on the status of the CPE device.

12. The system of claim 10, wherein analyzing the cable topology and the power topology comprises identifying one or more power network components that are proximate to area.

13. The system of claim 10, wherein analyzing the cable topology and the power topology comprises identifying one or more power network components that are located upstream of the network device.

14. The system of claim 10, wherein the processor is further operable to execute the computer-executable instructions to:
    determine customer addresses for the area;
    locate the customer addresses on the power topology; and
    identify at least one power network component located on the power network upstream from the customer addresses as the one or more potential failure locations.

15. The system of claim 10, wherein the network device is configured to receive power from the power network, and wherein the indication includes an indication that the network device is not receiving power from the power network.

16. The system of claim 10, wherein analyzing the cable topology and the power topology comprises associating addresses for one or more of the plurality of network devices with a power topology map.

17. A method, comprising:
   determining, by one or more processors, an indication that an outage has occurred on a cable network based on a status of a network device within the cable network, wherein the network device receives power from a power network;
   determining, by the one or more processors, location information for at least a portion of a plurality of network devices, including the network device, within the cable network;
   determining, by the one or more processors, a cable topology of the cable network at an area that includes a location that corresponds to the network device, wherein the cable topology of the cable network includes a routing and an orientation of the cable network;
   analyzing, by the one or more processors, the cable topology at the area; and
   identifying, by the one or more processors, based on the routing, the orientation, and a power topology of the power network at the area, one or more potential failure locations on the power network.

18. The method of claim 17, further comprising:
   determining, by the one or more processors, a status of a customer premise equipment (CPE) device within the area,
   wherein the one or more potential failure locations are further based on the status of the CPE device.

19. The method of claim 17, wherein analyzing the cable topology comprises identifying one or more power network components that are proximate to the area.

20. The method of claim 17, wherein analyzing the cable topology comprises identifying one or more power network components that are located upstream of the network device.

* * * * *